United States Patent [19]

Yiannoulos

[11] Patent Number: 4,705,322

[45] Date of Patent: Nov. 10, 1987

[54] PROTECTION OF INDUCTIVE LOAD SWITCHING TRANSISTORS FROM INDUCTIVE SURGE CREATED OVERVOLTAGE CONDITIONS

[75] Inventor: Aristides A. Yiannoulos, Wyomissing Hills, Pa.

[73] Assignee: American Telephone and Telegraph Company, AT&T Bell Laboratories, Murray Hill, N.J.

[21] Appl. No.: 752,128

[22] Filed: Jul. 5, 1985

[51] Int. Cl.$^4$ .............................................. H02H 3/20
[52] U.S. Cl. ..................................... 361/91; 361/101; 357/13
[58] Field of Search ....................... 361/86, 87, 91, 93, 361/98, 101; 357/13, 91; 330/298, 207 P

[56] References Cited

U.S. PATENT DOCUMENTS

| | | | |
|---|---|---|---|
| 3,395,317 | 7/1968 | Hanson | 361/91 |
| 3,435,295 | 3/1969 | Ladd, Jr. et al. | 361/101 |
| 3,600,695 | 8/1971 | Krausser | 330/11 |
| 3,992,650 | 11/1976 | Iwasa et al. | 361/91 X |
| 4,051,504 | 9/1977 | Hile | 357/13 |
| 4,074,334 | 2/1978 | D'Arrigo et al. | 361/79 |
| 4,106,048 | 8/1978 | Khajezadeh | 357/40 |
| 4,119,440 | 10/1978 | Hile | 148/1.5 |
| 4,178,619 | 12/1979 | Seiler et al. | 361/91 |
| 4,258,406 | 3/1981 | Seki | 361/79 |
| 4,302,792 | 11/1981 | Harwood | 361/92 |
| 4,333,120 | 6/1982 | Kotowski | 361/79 |
| 4,376,263 | 3/1983 | Pittroff et al. | 320/32 |
| 4,390,829 | 6/1983 | Jarrett | 323/231 |
| 4,405,964 | 9/1983 | Woods et al. | 361/18 |
| 4,599,631 | 7/1986 | Tsuzuki | 357/13 |
| 4,631,561 | 12/1986 | Foroni et al. | 357/91 X |

OTHER PUBLICATIONS

*IEEE Trans. on Electron Devices*, Sep. 1981, vol. ED-28, No. 9, "The Implanted Zener Diode . . . ", H. E. Maes et al., pp. 1071-1077.

*Primary Examiner*—A. D. Pellinen
*Assistant Examiner*—Derek S. Jennings
*Attorney, Agent, or Firm*—Wendy W. Koba

[57] ABSTRACT

An arrangement for protecting inductive load switching transistors during overvoltage conditions is disclosed. The arrangement comprises a Zener diode coupled between the collector and base of the switching transistor, where the Zener diode will break down during inductive load-created overvoltage conditions and turn on the transistor. A major portion of the surge current will then flow through the activated transistor. In a particular integrated circuit realization of the arrangement, the Zener diode is formed in the same semiconductor area as the transistor by extending a portion of the base diffusion region downward to contact the buried collector region.

3 Claims, 5 Drawing Figures

PROTECTION OF INDUCTIVE LOAD SWITCHING TRANSISTORS FROM INDUCTIVE SURGE CREATED OVERVOLTAGE CONDITIONS

BACKGROUND OF THE INVENTION

1. Field of the Invention

The present invention relates to protecting inductive load switching transistors from turn-off surge created overvoltage conditions and, more particularly, to achieving protection by means of circuitry the purpose of which is to engage the switching transistor to act towards protecting itself.

2. Description of the Prior Art

When a transistor junction is forced into breakdown by a reverse bias, irreversible damage to the junction will generally occur. If the damage is sustained across a collector-base junction of a bipolar junction transistor, the junction will become leaky. If the damage is sustained across an emitter-base junction, degradation in the gain characteristics of the transistor will occur. The spurious breakdown of a transistor junction during the course of normal operation is thus a hazard against which transistors in general may not be left unprotected.

Typical prior art solutions to protect transistors from surge-created overvoltage conditions utilize shunting arrangements consisting of diodes, Zener diodes, or both. One class of prior art shunting arrangements provide a bypass, or alternative path for a surge current to flow, so constituted as to fully keep a surge created voltage rise from developing across an exposed transistor. Alternative, prior art shunting arrangements permit the development of the surge, but function to clamp the surge created voltage rise to a level that will not exceed the breakdown voltage of an exposed transistor junction. U.S. Pat. No. 4,106,048 issued to H. Khajezadeh on Aug. 8, 1978 discloses a protection arrangement of the first class comprising a diode having a large contact area in shunt with the collector-emitter junction of the protected transistor. In clamp-action arrangements, a Zener diode may typically be involved, where one such arrangement is disclosed in U.S. Pat. No. 4,051,504 issued to J. W. Hile on Sept. 27, 1977. A related patent, U.S. Pat. No. 4,119,440, issued to J. W. Hile on Oct. 10, 1978, discloses the method of making the Zener diode device. Both patents discuss the use of an ion implanted Zener diode with appropriately accurate breakdown voltage, where the Zener diode is connected between the collector and emitter of the protected transistor for the purpose of variously shunting junctions susceptible to damage.

The choice of the protection arrangement in any particular case certainly must depend upon the overall objectives of the circuit. In general, a preferred protection arrangement is one which does not unduly encumber the operation of the protected device, or of the circuit, or both. However, a protection arrangement which also imparts some further operating advantage to the circuit might in some cases also exist. For example, in the commonly used arrangement for protecting relay driver circuits from coil fly-back transients adequate protection to the switching transistor could be offered with a single diode placed in parallel with the coil. However, it is known that placing across the coil a diode and a Zener diode tied together in series, advantageously provides the transistor with protection and further causes the speed of the switching action of the circuit to improve.

Inductive load switching circuits are a class of circuits particularly known for exposing transistor junctions to transient overstressing conditions. Functionally, these circuits switch on and off current activating inductive loads, such as current activating the coil of an electromechanical relay. This action generates inductive surges, and these surges create reverse, transient, overstressing conditions across the junctions of the transistors which are responsible for driving and hence, for switching these loads.

SUMMARY OF THE INVENTION

The present invention relates to protecting inductive load switching transistors from turn-off surge created overvoltage conditions and, more particularly, relates to achieving the necessary protection by means of circuitry the purpose of which is to engage the switching transistor to act towards protecting itself.

It is an object of the present invention to eliminate the need for shunt bypass diodes from the protection scheme since in an integrated circuit realization, such diodes are difficult to incorporate on the same substrate as the switching transistor which they protect.

Another object of the present invention is to reduce the size of an inductive load switching circuit by reducing the size and count of the components needed to provide protection to the switching transistor.

In a preferred embodiment of the present invention, a further object is to provide protection for a switching transistor through means which also impart a speed advantage to the performed switching action.

Yet another aspect of the present invention is to provide protection for the switching transistor by means of an arrangement which, in an integrated circuit realization, does not require additional silicon die area, but rather occupies an area of silicon already actively occupied by the switching transistor.

Other and further objects of the present invention will become apparent during the course of the following discussion and by reference to the accompanying drawings.

BRIEF DESCRIPTION OF THE DRAWINGS

Referring now to the drawings where like numerals represent like parts.

DETAILED DESCRIPTION

One method for switching an inductive load utilizes a saturating bipolar transistor as the load-driving device. The transistor operates in the common emitter configuration and provides ground closure for a load the other end of which ties directly or indirectly to a power rail. This method of switching a load is commonly known as the open collector driver method.

When the load in particular is inductive, the transition from the on to the off state creates an inductive surge. This occurs because current flowing through an inductor may not be interrupted discontinuously; on the moment the ground closure is removed, the current flowing through the inductive load must continue to flow at the same rate. Ensuingly, at the moment of ground interruption the inductive part of the voltage appearing across the load reverses polarity and rises to the level necessary to force the completion of a circuit permitting the load current to so flow. Since this voltage, or a portion of it, also appears directly across the switching transistor and adds to the stress the steady-state bias already exerts on this transistor, precipitously this voltage creates a hazard. The circuit must provide explicit means for limiting this sum-stressing to a level the switching transistor is capable of sustaining. If not, the switching transistor shall be breaking down spuriously during the course of normal circuit operation.

Figure 1:
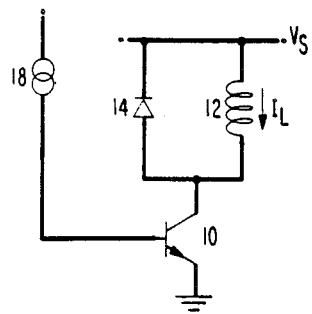
FIG. 1 illustrates a basic prior art inductive load switching circuit where protection for the switching transistor is provided by a shunt comprising a diode and appearing across the inductive load.

FIG. 1 illustrates a simple prior art arrangement where a transistor 10 being a switch for an inductive load 12 is explicitly protected against inductive surging through means of diode 14 placed across inductive load 12. The surge current sourced by inductive load 12 when transistor 10 is turned off, denoted $I_L$, in this case finds a path through forward biased diode 14 back to inductive load 12. This arrangement limits the reverse transient voltage $V_L$ developed across inductive load 12 to one forward-diode drop ($V_{BE}$) as developed across diode 14; accordingly, the maximum voltage appearing across the switching transistor is being limited to exactly the sum of $V_S$ plus one $V_{BE}$. Another part of this circuit is current source 18 which is shown connected to the base of transistor 10. This source is the agent responsible for turning transistor 10 "on" and "off". In particular, as it responds to the action of this source, transistor 10 provides the ground closure which activates or deactivates inductive load 12.

Figure 2:
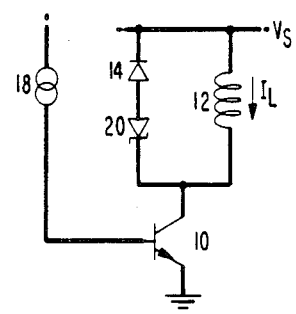
FIG. 2 illustrates an alternative prior art inductive load switching circuit where protection for the switching transistor is provided by a shunt comprising a diode and a Zener diode serially connected and appearing across the inductive load.

The Pittroff et al reference cited above disclosed an alternative protection means comprising a diode and a Zener diode serially connected. This essentially discloses a variation of the arrangement well known in the art and illustrated in FIG. 2, where a Zener diode 20, connected in series with a diode 14, appear as a shunt across inductive load 12. The circuit illustrated here is considered to be an improvement over that illustrated in FIG. 1. In particular, the addition of Zener diode 20 improves the speed of the switching action of the circuit because the rate of dissipation of the magnetic energy stored in the load is presently proportional to $V_{BE}+V_{ZB}$, ($V_{ZB}$ being the voltage drop across Zener diode 20), instead of only $V_{BE}$ ($V_{BE}$ being the voltage developed across diode 14).

A disadvantage of both of these prior art arrangements arises in association with junction isolated integrated technologies where it becomes very difficult to realize effectively the individual components required by such load-shunt schemes, namely diode 14 and Zener diode 20. The integration of Zener diode 20 gives rise to problems with respect to maximum power dissipation and thereby device reliability, while often the parasitic actions of the isolation junction associated with diode 14 can interfere severely with the operation of the circuit, by directly affecting the operation of transistor 10 or of other adjacent components carried on the same die.

Figure 3:
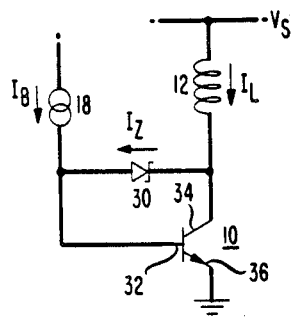
FIG. 3 illustrates an inductive load switching circuit formed in accordance with the present invention where the means for protecting the switching transistor is a Zener diode connected across the collector-base junction of the switching transistor.

These and other problems associated with prior art arrangements have been solved in accordance with the protection arrangement of the present invention, of which an exemplary embodiment is illustrated in FIG. 3. As shown, diode 14 and Zener diode 20 have been replaced by a Zener diode 30 connected between the base 32 and collector 34 of bipolar junction transistor 10. In accordance with the present invention, Zener diode 30 is chosen to break down and begin drawing current at a voltage, $V_Z$, less than the breakdown voltage $BV_{CEO}$ of transistor 10 but greater than the voltage difference $V_S - V_{BE}$, so as not to interfere with the operation of the circuit when the load is inactive, where $V_S$ is defined as the supply voltage and $V_{BE}$ is defined as the "on" base-to-emitter voltage of transistor 10. Here notably, the portion of the total surge current, $i_L$, flowing through Zener diode 30, denoted $i_Z$, is determined in accordance with the relation $$i_Z = i_L/(\beta+1), \tag{1}$$

and has an initially attained maximum of $$I_Z = I_L/(\beta+1), \tag{2}$$

where $I_L$ is defined as the steady state current flowing through inductive load 12 before current $I_b$ supplied by source 18 is turned off, and $\beta$ is defined as the common emitter gain of transistor 10. Therefore, in accordance with equation (1) as the surge develops, a small portion of surge current $i_L$ (as determined by the gain of transistor 10) will flow through Zener diode 30 and into the base 32 of transistor 10. The current $i_Z$ flowing through base 32 of transistor 10 causes transistor 10 to turn on for the duration of the surge, thereby allowing the remainder of the surge current, $i_L - i_Z$, to flow through collector lead 34 and emitter lead 36 of transistor 10 to ground.

Thus, while a path to ground for the inductive surge is provided by the re-activated transistor 10, the reverse voltage transient developed across inductive load 12 gets clamped to the value $V_Z + V_{BE}$. Zener diode 30 having been designed in accordance with the present invention such that $V_Z + V_{BE}$ is less than the breakdown voltage, $BV_{CEO}$, of transistor 10, this then results in transistor 10 being kept from entering its collector-base breakdown mode through the duration of the surge phase entirely.

In an integrated realization, this action will further protect the transistor against entering its collector-isolation junction breakdown mode, provided that $V_Z + V_{BE}$ is also smaller than $BV_{CIO}$, $BV_{CIO}$ being defined as the collector-isolation breakdown voltage of the transistor. As in most technologies the $BV_{CIO}$ of a transistor is generally greater than its $BV_{CEO}$, this condition will be implicitly satisfied, and the collector-isolation junction will thereby receive the protection by default.

Figure 4:
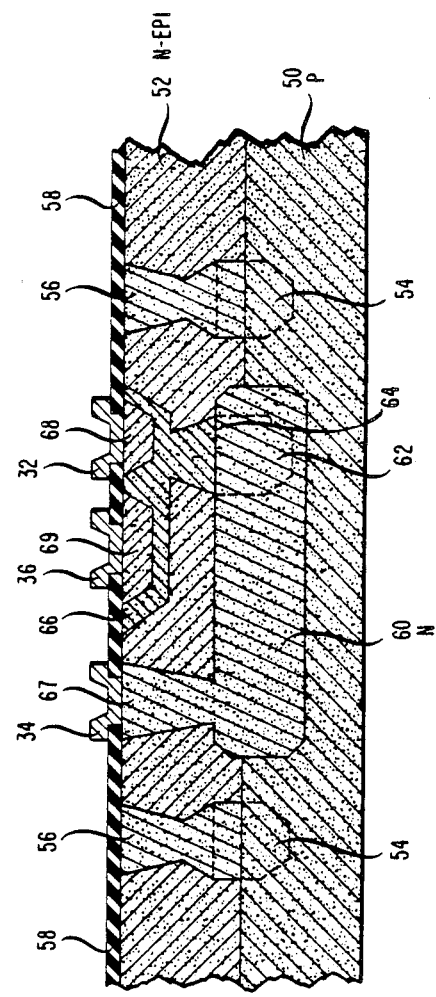
FIG. 4 illustrates a merged structure, integrated realization of the transistor and Zener diode portions of the circuit illustrated in FIG. 3.

A significant advantage of the present invention, as it relates to the above-described bipolar driver realization, is that Zener diode 30 may be merged into the collector-base junction of transistor 10 as a buried Zener diode. A cross-sectional view of such a merged arrangement of Zener diode 30 and transistor 10 is illustrated in FIG. 4. A p-type substrate layer 50 is utilized upon which an n-type epitaxial layer 52 is formed. An isolation feature comprising a buried p-type ring feature 54 and a surface diffused p-type ring feature 56 isolates transistor 10 from other devices constructed on substrate 50. Base, collector, and emitter metal contacts 32, 34 and 36 are provided through vias in an insulating layer 58 which is disposed over epitaxial layer 52. A buried n-type feature 60 extends into a region of substrate 50 underneath both p-type base feature 66 and n-type emitter feature 69, forming the conductor path for the collector current. The collector current travels through n-type feature 60 and into collector contact 34 by means of an n-type enhancement diffusion 67.

In accordance with the present invention, Zener diode 30 is formed from a buried p-type feature 62 disposed under base contact 32 and extending upward to contact base feature diffusion region 66 as shown in FIG. 4. In this construction, a Zener junction is created along a pn boundary 64 shown in FIG. 4. P-type feature 68 contributes a p+ downward enhancement for base contact 32 and functions to reduce the parasitic series resistance associated with Zener diode 30.

As specifically discussed in U.S. Pat. No. 4,087,900, assigned to the same assignee of this application, the intersection of a buried N-layer with a buried-P layer utilizing the technology taught in U.S. Pat. No. 4,087,900, taken as an example, would thus produce a 17-volt buried Zener diode. Then whereas buried p-type feature 62 could in this and other similar technologies be formed during the same processing step as the formation of buried p-type isolation ring 54, the addition of a buried Zener diode protection arrangement in accordance with the present invention would not, in these technologies, necessitate the addition of further processing steps for the formation of Zener diode 30. Also, as stated hereinbefore and can be seen by reference to FIG. 4, Zener diode 30 does not necessarily require any area in the semiconductor device which is not already occupied by transistor 10. Thus, as compared with prior art arrangements, the present invention provides a similar degree of protection, but potentially at no die cost.

Figure 5:
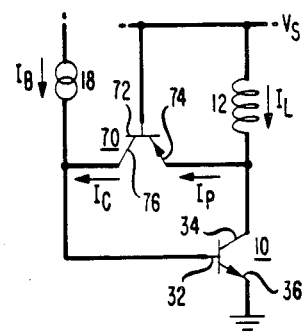
FIG. 5 illustrates an alternative embodiment of the present invention where a PNP type transistor is the means protecting an NPN type load switching transistor.

An alternative embodiment of the present invention is illustrated in FIG. 5, where switching transistor 10 is protected from inductive surge currents by the presence of a complementary-type transistor 70. That is, if transistor 10 is an NPN-type transistor, as is shown in FIG. 5, transistor 70 must be a PNP-type transistor. Alternatively, if transistor 10 is a PNP-type transistor, transistor 70 must be an NPN-type transistor. As shown in FIG. 5, the base 72 and emitter 74 of PNP transistor 70 are connected across inductive load 12 and collector 76 is connected to base 32 of NPN transistor 10. Collector 34 of NPN transistor 10 is connected to emitter 74 of PNP transistor 70 and then also to the end of the load driven. In accordance with the present invention, PNP transistor 70 must be chosen such that the emitter 74 to base 72 breakdown voltage, denoted $BV_{EBO}$, exceeds the voltage available from the power supply $V_S$ minus one (NPN) saturated collector-emitter voltage drop $V_{CE(SAT)}$, and collector 76 to base 72 breakdown voltage of PNP transistor 70, denoted $BV_{CBO}$, exceeds the voltage $V_S$ minus one forward emitter-base voltage of NPN transistor 10 ($V_{BE}$).

The embodiment of the present invention as illustrated in FIG. 5 performs in a similar manner as the previously-described embodiment which utilized Zener diode 30. In particular, when NPN transistor 10 is turned off, the voltage $V_L$ across inductive load 12 reverses polarity as to support a surge current $I_L$, which while flowing in the same direction as before, now may activate PNP transistor 70 of FIG. 5. Thus a small portion of surge current $I_L$, denoted $I_P$, will flow into emitter 74 of PNP transistor 70 (as the voltage sourced by load 12 rises and becomes increasingly positive), activating PNP transistor 70 and thus causing a current $I_C$ to flow through collector 76 of PNP transistor 70 and subsequently base 32 of NPN transistor 10. The relationships between $I_L$ and $I_P$, and $I_L$ and $I_C$ as exist at the moment the load activating current $I_B$ is turned off may be expressed as $$I_P = I_L/(1+\alpha\beta), \tag{3}$$

$$I_C = \alpha I_L/(1+\alpha\beta), \tag{4}$$

where $\alpha$ is defined as the common-base current-gain of PNP transistor 70 and $\beta$ is defined as the common-emitter current-gain of NPN transistor 10. In accordance with the present invention, current $I_C$ activates NPN transistor 10, and allows a major portion of the surge current, namely the current $I_L - I_P$, to flow through NPN transistor 10. Further, this action clamps the excess voltage rise as contributed by the inductive surge to one $V_{BE}$ as developed across the emitter-base junction of PNP transistor 70.

Therefore, while the clamping action of this circuit is comparable to that attained via the method shown in FIG. 1 (an arrangement representing the prior art), the present invention can provide this action by means of a device that physically and electrically can be much smaller than was previously necessary. This can be appreciated by observing that while diode 14 of FIG. 1 must conduct the surge current in full, the present invention requires that the emitter-base and collector-base junctions of transistor 70 be capable of conducting only small fractions of this surge current.

What is claimed is:

1. Integrated circuit arrangement including an inductive load switching transistor with overvoltage protection, said arrangement comprising:

a semiconductor substrate of a first conductivity type, an epitaxial layer of a second conductivity type, including first and second major surfaces, overlying the substrate such that the first major surface is in intimate contact with said substrate, said inductive load switching transistor being formed in the substrate and epitaxial layer and comprising a buried collector region of the second conductivity type formed in said substrate and said epitaxial layer in the region of said epitaxial layer first major surface, a collector contact region extending from the second major surface of the epitaxial layer downward to contact the buried collector, a base region of the first conductivity type formed between the buried collector region and the second major surface of the epitaxial layer, contact means contacting the base region, an emitter region of the second conductivity type formed in the second major surface of the epitaxial layer and surrounded by said base region, contact means contacting the emitter region, the invention characterized by an additional region of the first conductivity type extending from a portion of the base region to, and into contact with, the buried collector region to form, with the buried collector, a pn junction Zener diode for forward biasing during overvoltage conditions and activating the inductive load switching transistor and allowing a portion of any overvoltage-created current to flow through said inductive load switching transistor.

2. The integrated circuit arrangement of claim 1 in which the additional region of the first conductivity type extends into the collector region of the second conductivity type in an overlapping relationship with said collector region, thus forming an overlapping region, the overlapping region characterized by a reduced conductivity of the second type.

3. The integrated circuit arrangement of claim 2 characterized further by an isolation ring of the first conductivity type formed in the epitaxial layer surrounding both the said base region and the collector region, said isolation ring extending from the surface of the epitaxial layer to at least the substrate below, the device further characterized in that the isolation ring and the said additional region of the first conductivity type have the same impurity level.

* * * * *